(12) United States Patent
Chen et al.

(10) Patent No.: US 6,717,237 B2
(45) Date of Patent: Apr. 6, 2004

(54) INTEGRATED CHIP DIODE

(76) Inventors: Chun-Hua Chen, No. 12, Lane 44, Chiaohsin Rd., Hsin Tien City, Taipei Hsien (TW); Hsiao-Ping Chu, No. 42-3, CHin Shan Hsin Village, Tahsi Town, Taoyuan Hsien (TW)

( * ) Notice: Subject to any disclaimer, the term of this patent is extended or adjusted under 35 U.S.C. 154(b) by 0 days.

(21) Appl. No.: 10/229,022

(22) Filed: Aug. 28, 2002

(65) Prior Publication Data

US 2004/0043532 A1 Mar. 4, 2004

(51) Int. Cl.[7] .............................................. H01L 23/58
(52) U.S. Cl. ...................... 257/594; 257/622; 257/656; 257/698; 257/173; 257/774; 257/773
(58) Field of Search ................................ 257/594, 622, 257/656, 698, 621, 173, 773, 774

(56) References Cited

U.S. PATENT DOCUMENTS 3,787,252 A * 1/1974 Filippazzi et al. .......... 438/492
4,816,421 A * 3/1989 Dynes et al. ................... 117/9
5,914,527 A * 6/1999 Freeman et al. ............. 257/623

* cited by examiner

Primary Examiner—Jerome Jackson
(74) Attorney, Agent, or Firm—Bacon and Thomas (57) ABSTRACT

The invention relates to an integrated chip diode manufactured by forming two different typed semiconductors on the top and bottom of a wafer respectively and forming a plurality of diodes thereon, each diode comprises glass insulator encapsulated on sides thereof, two conductive metal layers formed on the surfaces of the semiconductors respectively, an insulation material coated on a portion of the surface of one conductive metal layer and a third conductive metal layer sintered on the glass insulator, such that the other conductive metal layer can be electrically connected to the insulation material on the one conductive metal layer via the third conductive metal layer. Thus, two independent soldered conductive terminals are formed at the same sides of the diodes and electrically connected to each of different typed semiconductors.

2 Claims, 8 Drawing Sheets

INTEGRATED CHIP DIODE

FIELD OF THE INVENTION

The present invention relates to diode manufacturing process and more particularly to an integrated chip diode (ICD) with improved characteristics.

BACKGROUND OF THE INVENTION

A conventional diode device comprises a silicon die, two conductive metal pieces each soldered to either side of the silicon die, and two conductors each soldered to another side (i.e., opposite to the silicon die) of either conductive metal piece wherein the conductors are further connected to other electronic devices. In a conventional manufacturing process of the diode device, the silicon die is formed integrally with the conductive metal pieces first. Then, an etching process is performed on the silicon die. After that, an encapsulation process is performed on the etched silicon die to encapsulate the silicon die and the conductive metal pieces with an insulator, and finishes the production of the conventional diode device.

However, the prior art suffered from several disadvantages. For example, an epoxy or other adhesive is employed to encapsulate the etched silicon die in the conventional manufacturing process of the diode device. One drawback of epoxy or other adhesive is that its heat-resisting capability is low. Hence, a diode device incorporating the epoxy or other adhesive, either for providing a high power input current of rectification device or placed in a high temperature environment, tends to damage due to high heat. As a result, an electronic product incorporating such diode devices may not function normally, resulting in a shortening of useful life, poor quality, and maintenance difficulty of the electronic product. Moreover, a body formed by the epoxy or other adhesive inevitably occupies a predetermined space. As a result, a further reduction of size of the diode device is made impossible. Thus improvement exists.

SUMMARY OF THE INVENTION

The invention relates to an integrated chip diode (ICD), which is manufactured by utilizing a diffusion process for forming p+-type and n+-type semiconductors (or n+-type and p+-type semiconductors) each having a predetermined thickness on a top and a bottom of a semiconductor wafer respectively. A plurality of semiconductor manufacture techniques including photolithography, etching, implanting, and sintering are also employed to form a plurality of diodes on the wafer. Sides of each diode are encapsulated with glass insulator. A conductive metal layer is formed on the top of the p+-type semiconductor and the bottom of the n+-type semiconductor respectively. An insulation material is coated on a portion of surface of one of the conductive metal layers. A third conductive metal layer is formed on the glass insulator by using sintering process. As such, the other one of the conductive metal layers can be electrically connected to the insulation material on the one of the conductive metal layers via the third conductive metal layer on the glass insulator.

A primary object of the present invention is to form two independent soldered conductive terminals at the same side (either top or bottom) of each diode. As such, each soldered conductive terminal is electrically connected to each of p+-type and n+-type semiconductors. As an end, a produced diode has a characteristic of surface mount device (SMD) for directly mounting on an associated electronic circuit.

Another object of the present invention is to coat the glass insulator on a periphery of the diode by means of glass sintering in a manufacturing process for effectively improving a heat transfer characteristic, increasing an operating temperature, and greatly reducing a size of the diode.

Still another object of the present invention is to produce a diode having a characteristic of SMD without performing a subsequent encapsulation process.

The above and other objects, features and advantages of the present invention will become apparent from the following detailed description taken with the accompanying drawings.

DETAILED DESCRIPTION OF THE PREFERRED EMBODIMENTS

The invention is directed to an integrated chip diode, which is manufactured by utilizing a diffusion for forming p+-type and n+-type semiconductors each having a predetermined thickness on a top and a bottom of a semiconductor wafer respectively to form a plurality of diodes on the wafer. Then, sides of each diode are encapsulated with glass insulator, and conductive metal layer is formed on the top of one semiconductor and the bottom of the other semiconductor respectively. An insulation material is coated on a portion of surface of one of the conductive metal layers. A third conductive metal layer is formed on the glass insulator by sintering process. As such, the other conductive metal layer can be electrically connected to the insulation material on the one conductive metal layer via the third conductive metal layer. Thus, two independent soldered conductive terminals at the same sides of the diodes are formed. As such, each soldered conductive terminal is electrically connected to each of different typed semiconductors of the diode. As an end, a diode product having a characteristic of surface mount device (SMD) is formed without performing a subsequent encapsulation process. Note that the diode product (i.e., integrated chip diode) is hereinafter called ICD throughout the description of the invention.

Since in the process of the ICD, the cross-sectional structures along axes X—X and Y—Y of the above-identified semiconductor material are not the same. Thus, in the following description of the preferred embodiments of the invention, the differences between the cross-sectional structures along axes X—X and Y—Y of the semiconductor will be explained specifically.

Figure 1:
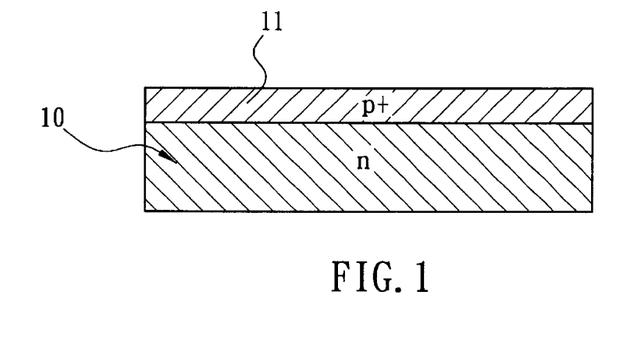
FIG. 1 is a cross-sectional view of a wafer after forming a p+-type semiconductor layer thereon by diffusion according to a preferred embodiment of the invention.
Figure 2A:
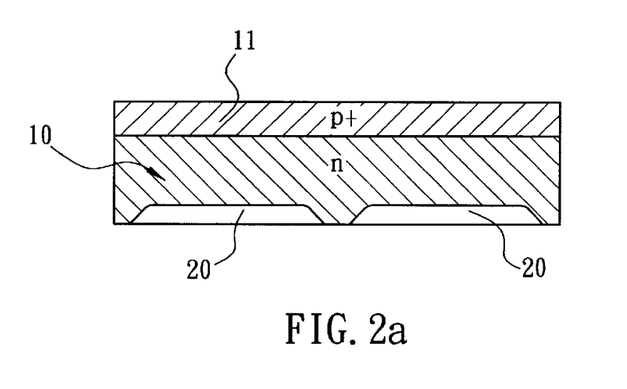
FIGS. 2a and 2b are cross-sectional views taken along axes X—X and Y—Y of the wafer after forming a plurality of channels having rectangular sections on the wafer by photolithography and trench etching in the preferred embodiment respectively.
Figure 2B:
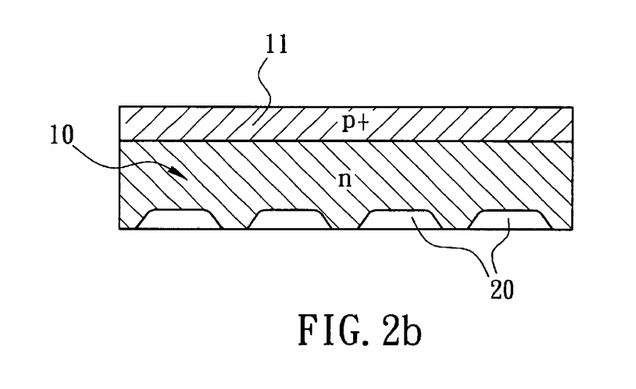
Figure 3A:
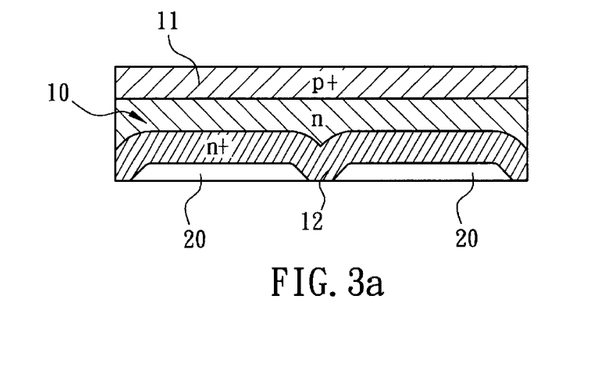
FIGS. 3a and 3b are cross-sectional views taken along axes X—X and Y—Y of the wafer after forming a n+-type semiconductor layer thereon by diffusion in the preferred embodiment respectively.
Figure 3B:
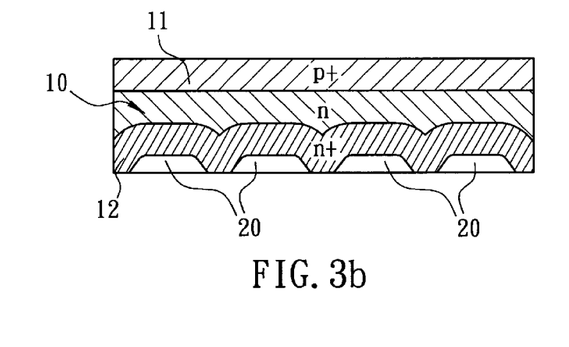
Figure 4A:
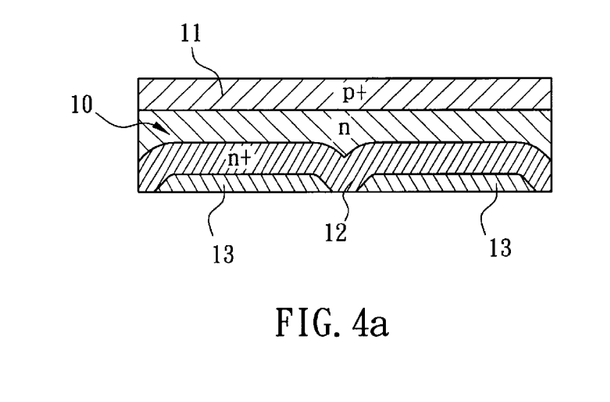
FIGS. 4a and 4b are cross-sectional views taken along axes X—X and Y—Y of the wafer after filling and sintering a metal paste in the channels in the preferred embodiment respectively.
Figure 4B:
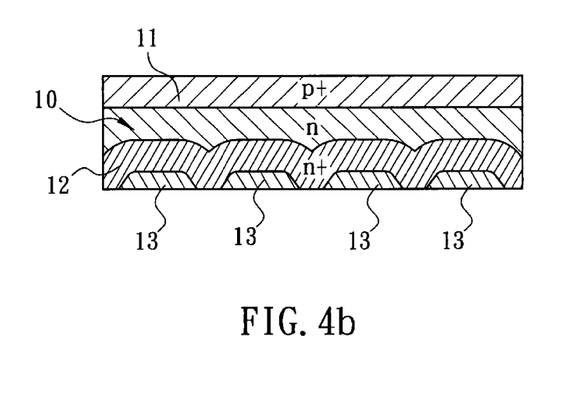
Figure 5:
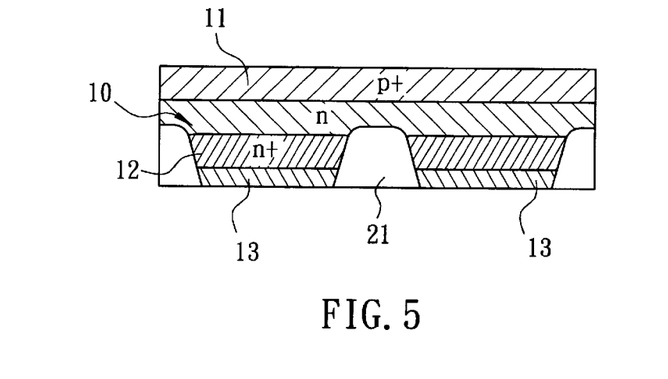
FIG. 5 is a cross-sectional view taken along axis X—X showing a ditch formed along Y-axis and disposed between two adjacent first metal layers by photolithography and trench etching in the preferred embodiment.
Figure 6A:
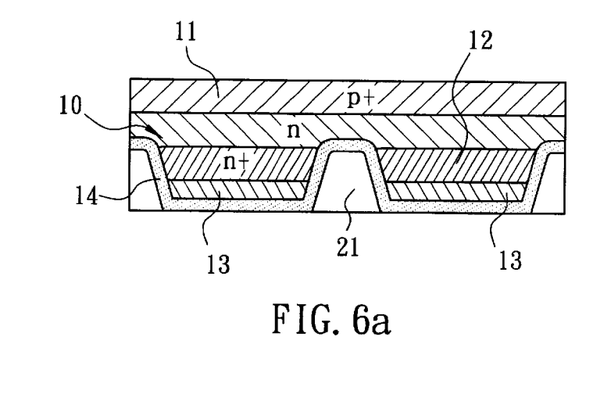
FIGS. 6a and 6b are cross-sectional views taken along axes X—X and Y—Y of the wafer after forming a SiO$_2$ layer on a bottom of the wafer by depositing or implanting in the preferred embodiment respectively.
Figure 6B:
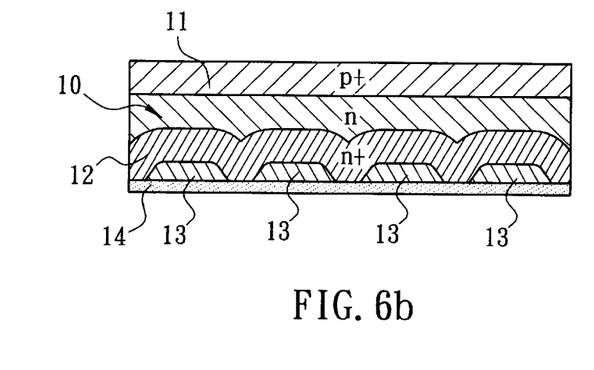

Referring to FIG. 1, there is shown a preferred embodiment of the invention, wherein boron ions are diffused onto the top of a n-type semiconductor wafer 10 to form a p+-type semiconductor 11 having a predetermined thickness. Then, a plurality of rectangular channels 20 are formed on the bottom of the n-type wafer by photolithography and trench etching. This is best shown in a cross-sectional view taken along axis X—X of FIG. 2a, where two rectangular channels 20 are formed along the transverse section of axis X—X for manufacturing four ICDs from the wafer. Further, FIG. 2b is a cross-sectional view taken along axis Y—Y, where four rectangular channels 20 are formed along the longitudinal section of axis Y—Y for manufacturing the same from the wafer. Thereafter, the boron ions are diffused onto bottom of n-type wafer 10 to form a n+-type semiconductor 12, as shown in the cross-sectional views taken along axes X—X and Y—Y of FIGS. 3a and 3b, having a predetermined thickness according to the invention. Then, filling metal paste (e.g., copper paste, silver paste, gold paste, or the like) in the channels 20 and sintering the metal paste filled in the channels 20 to form a first metal layer 13 on each of the channels 20, as shown in the cross-sectional views taken along axes X—X and Y—Y of FIGS. 4a and 4b respectively. A ditch 21 is formed along Y-axis disposed between two adjacent first metal layers 13 by photolithography and trench etching as shown in a cross-sectional view taken along axis X—X of FIG. 5 according to the invention. A depth of the ditch 21 is required to penetrate the n+-type semiconductor 12 to reach the n-type wafer 10. Then a CVD (Chemical Vapor Deposition) or implanting is utilized to deposit or implanting a silicon dioxide ($SiO_2$) layer 14 uniformly on bottom of the n-type wafer 10 (i.e., on surfaces of the metal layers 13 and the ditch 21) as shown in cross-sectional views taken along axes X—X and Y—Y of FIGS. 6a and 6b. Also, the $SiO_2$ layer 14 is served as a first insulator layer of the ICD. Note that the CVD may be replaced by a PVD (Physical Vapor Deposition) or PCVD (Photon-induced Chemical Vapor Deposition) in other preferred embodiments without departing from the scope and spirit of the invention.

Further note that in the embodiment, though the p+-type and n+-type semiconductors 11 and 12 on top and bottom of the n-type semiconductor wafer 10 each having a predetermined thickness are formed respectively by utilizing ion diffusion. While it is appreciated by those skilled in the art that the scope of the invention is not limited to the specific embodiment. To the contrary, any other diffusion or implanting being employed to form p+-type and n+-type semiconductors (or p+-type and n+-type semiconductors) each having a predetermined thickness on top and bottom of a n-type (or p-type) semiconductor wafer 10 should be deemed as without departing from the scope and spirit of the invention. All of the above are still within the definition of semiconductor wafer according to the invention.

Figure 7:
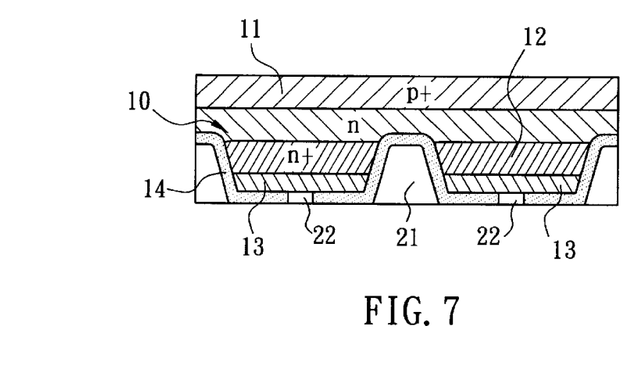
FIG. 7 is a cross-sectional view taken along axis X—X of the wafer after forming a groove along Y-axis disposed between two adjacent ditches by photolithography and trench etching in the preferred embodiment.
Figure 8:
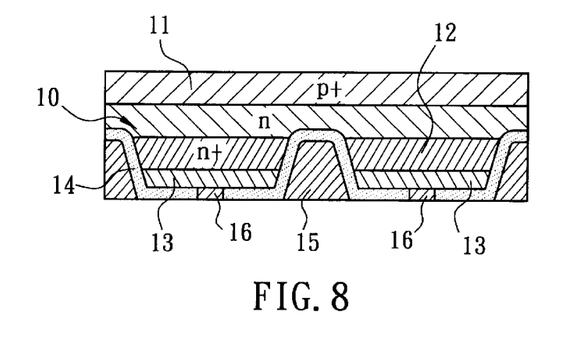
FIG. 8 is a cross-sectional view taken along axis X—X of the wafer after forming second and third metal layers by sintering the metal paste filled in the ditch and the groove by photolithography and trench etching in the preferred embodiment.

Referring to a cross-sectional view taken along axis X—X of the wafer as illustrated in FIG. 7, a groove 22 is formed along Y-axis and disposed between two adjacent ditches 21 by photolithography and trench etching in the embodiment. As shown, a depth of the groove 22 reaches the first metal layer 13. Then, filling the metal paste (e.g., copper paste, silver paste, gold paste, or the like) in the ditches 21 and the grooves 22 prior to sintering. Thus, after sintering, a plurality of second metal layers 15 and third metal layers 16 are formed in the ditches 21 and the grooves 22 respectively as illustrated in a cross-sectional view taken along axis X—X of FIG. 8. As such, the third metal layer 16 is electrically connected to the n+-type semiconductor 12 via the first metal layer 13 for serving as a soldered metal layer of the ICD of the invention for electrically connecting to the n+-type semiconductor 12.

Figure 9A:
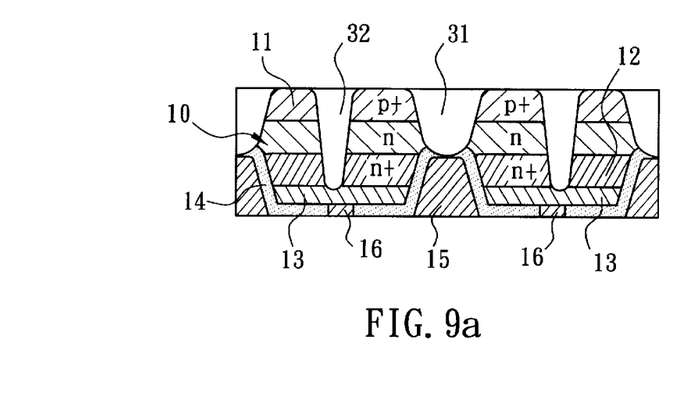
FIGS. 9a and 9b are cross-sectional views taken along axes X—X and Y—Y of the wafer after forming second ditch and second groove on top of the wafer along Y-axis by photolithography and trench etching in the preferred embodiment respectively.
Figure 9B:
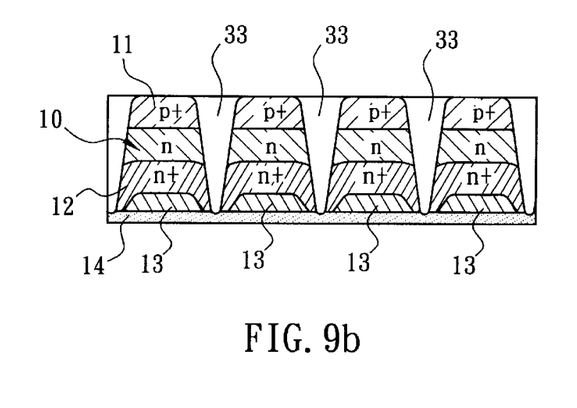

Referring to FIG. 9a, there is illustrated a cross-sectional view taken along axis X—X of the wafer showing a plurality of second ditches 31 and second grooves 32 formed on top of the wafer 10 along Y-axis corresponding to the second metal layers 15 and the third metal layers 16 by photolithography and trench etching in the embodiment. As shown, depth of second ditch 31 reaches the $SiO_2$ layer 14 while that of the second groove 32 penetrates the n+-type semiconductor 12 to reach the first metal layer 13. Also, referring to FIG. 9b, there is illustrated a cross-sectional view taken along axis Y—Y showing a plurality of third grooves 33 formed on top of the wafer 10 along X-axis with each third groove 33 disposed between two adjacent first metal layers 13. As shown, depth of third groove 33 reaches the $SiO_2$ layer 14.

Figure 10A:
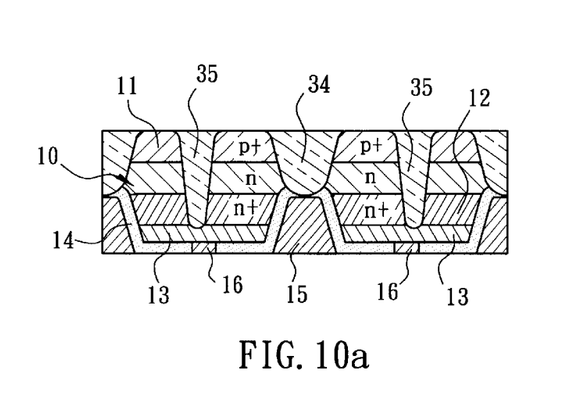
FIGS. 10a and 10b are cross-sectional views taken along axes X—X and Y—Y of the wafer after filling and sintering a glass paste in the second ditch and the second groove in the preferred embodiment respectively.
Figure 10B:
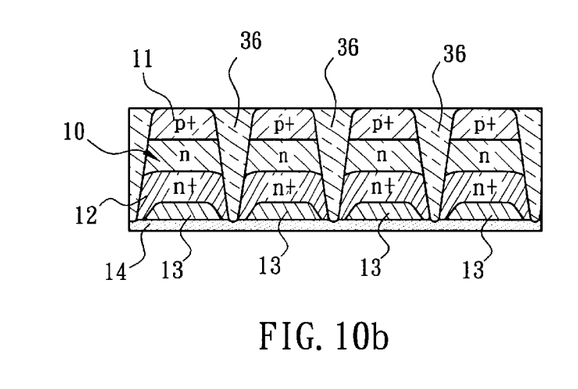
Figure 11:
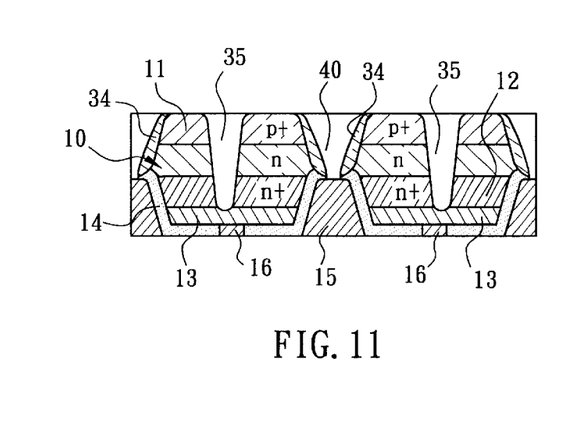
FIG. 11 is a cross-sectional view taken along axis X—X of the wafer after dugging gutter on the glass formed in the second ditch on top of the wafer along Y-axis in the preferred embodiment.
Figure 12A:
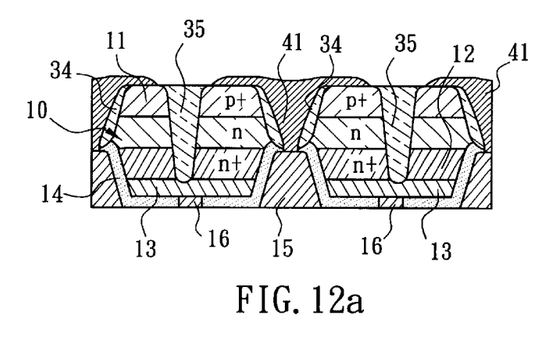
FIGS. 12a and 12b are cross-sectional views taken along axes X—X and Y—Y of the wafer after forming a fourth metal layer on top of the wafer corresponding to a region ranged from upper surface of the p+-type semiconductor to the gutter in the preferred embodiment respectively.
Figure 12B:
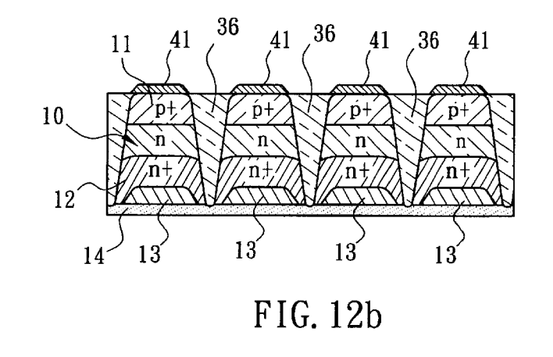

Referring to FIGS. 10a and 10b, there are illustrated two cross-sectional views taken along axes X—X and Y—Y of the wafer showing that glass paste formed by mixing glass powder and adhesive is filled in the second ditches 31 and the grooves 32 and 33 prior to sintering in the embodiment respectively. After sintering, a plurality of sintered glass columns 34, 35 and 36 are formed, which are coated on two sides of the ICD of the invention to encapsulate the ICD. Next, to dig gutter 40 on the glass column 34 in the second ditch 31 along Y-axis to remove excessive glass with remaining glass sufficient to encapsulate the sides of the ICD as illustrated in a cross-sectional view taken along axis X—X of FIG. 11. As shown, depth of a gutter 40 formed by digging the glass column 34 reaches the second metal layer 15. Referring to FIGS. 12a and 12b, there are illustrated cross-sectional views taken along axes X—X and Y—Y respectively wherein low temperature metal paste (e.g, copper paste, silver paste, gold paste, or the like) is filled on top of the wafer 10 corresponding to a region ranged from upper surface of the p+-type semiconductor 12 to the gutter 40 prior to sintering. After sintering, a fourth metal layer 41 is thus formed. As such, the second metal layer 15 is electrically connected to the p+-type semiconductor 11 via the fourth metal layer 41 for serving as another soldered metal layer of the ICD of the invention for electrically connecting to the p+-type semiconductor 11.

Figure 13A:
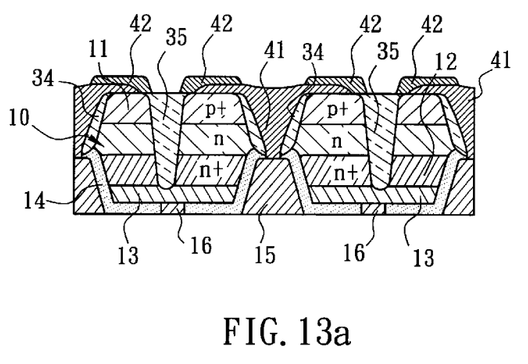
FIGS. 13a and 13b are cross-sectional views taken along axes X—X and Y—Y of the wafer after forming a sintered glass insulator layer on top of the wafer corresponding to the p+-type semiconductor in the preferred embodiment respectively.
Figure 13B:
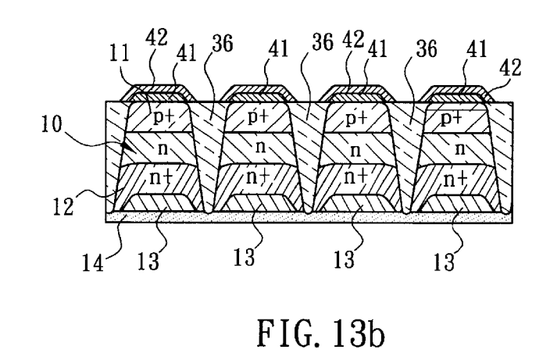

Finally, referring to FIGS. 13a and 13b, there are illustrated two crosssectional views taken along axes X—X and Y—Y respectively wherein glass insulator paste is coated on top of the wafer 10 corresponding to the p+-type semiconductor 11 prior to sintering. After sintering, a glass insulator layer 42 is formed on the p+-type semiconductor 11 accordingly. This completes an encapsulation on top of the ICD. Next, referring to FIGS. 14a and 14b, there are illustrated two cross-sectional views taken along axes X—X and Y—Y respectively wherein on a position corresponding to the second ditch 31, the second groove 32 and the third groove 33 along X and Y axes a cutting is performed on the wafer 10 to form a plurality of encapsulated ICDs 50. In the embodiment, two independent soldered metal layers (e.g., the second and the third metal layers 15 and 16) are formed on the same side (e.g., bottom) of the ICD 50. As such, each soldered metal layer may be electrically connected to p+ and n+-type semiconductors of the ICD 50 to serve as a conductive terminal of a surface mount device (SMD).

Figure 14A:
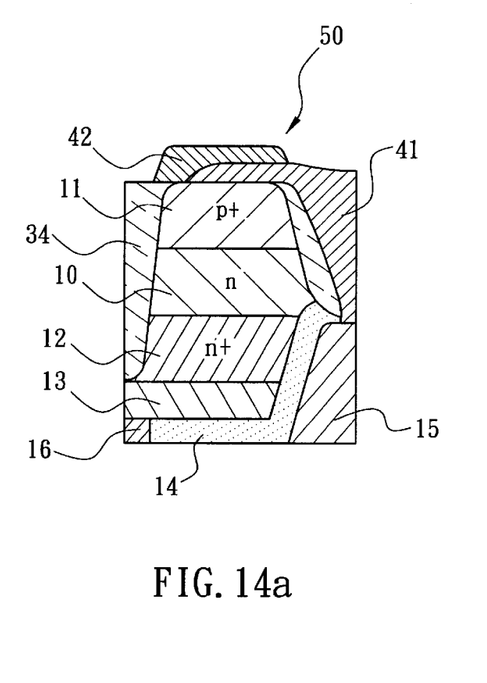
FIGS. 14a and 14b are cross-sectional views taken along axes X—X and Y—Y of a chip diode formed by cutting the wafer in the preferred embodiment respectively.
Figure 14B:
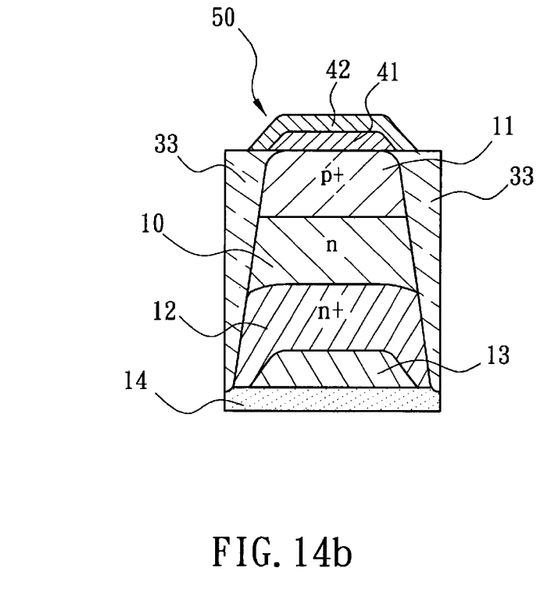

In the invention, for the purposes of protecting metal layers on the ICD 50 from oxidizing for plating and forming a protection layer on the metal layers, sequential testing and packing are performed on the ICD 50. As such, an ICD product for SMD without performing a subsequent encapsulation process is produced. The ICD product has the advantages of greatly reduced size and effectively improving a heat transfer characteristic.

Figure 15A:
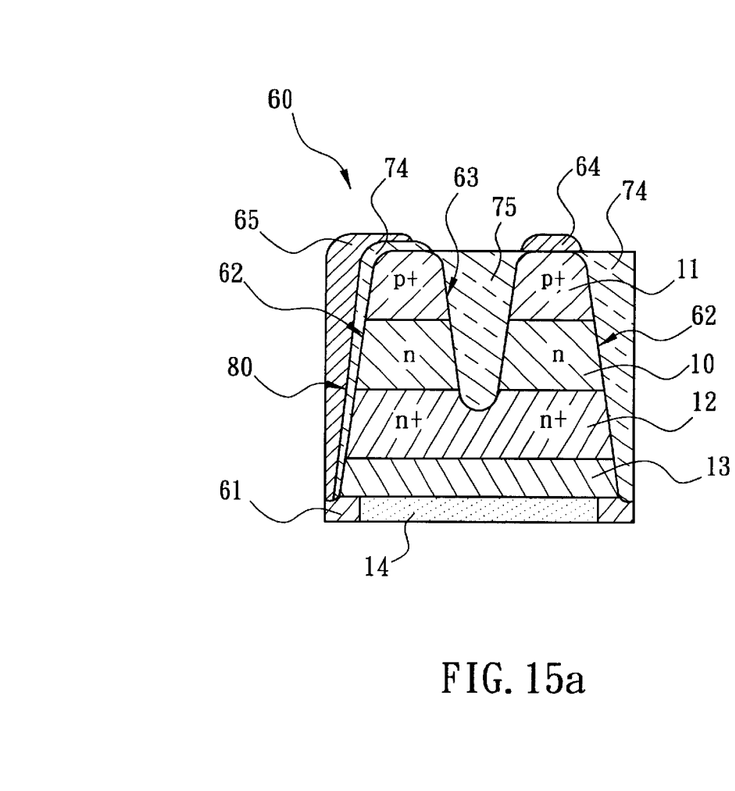
FIGS. 15a and 15b are cross-sectional views taken along axes X—X and Y—Y of a formed chip diode according to another preferred embodiment of the invention respectively.
Figure 15B:
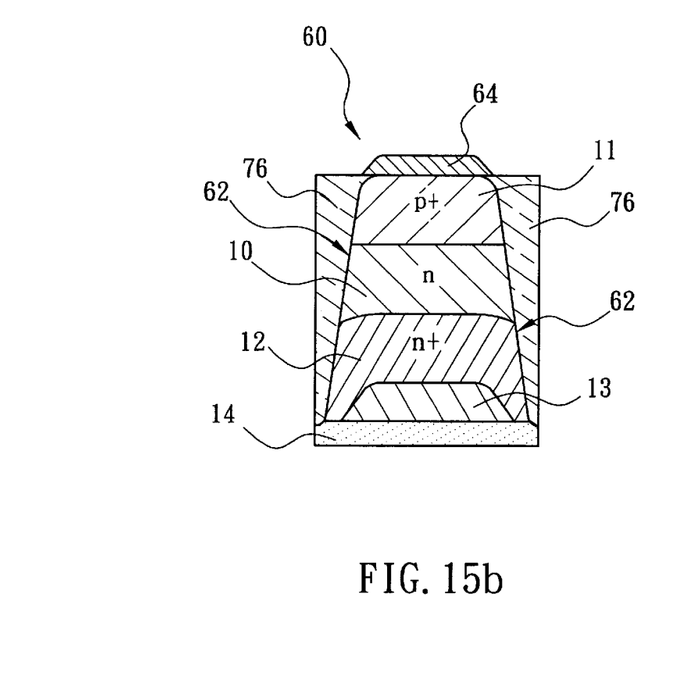

Referring to FIGS. 15a and 15b, there are illustrated two cross-sectional views taken along axes X—X and Y—Y of a formed ICD 60 according to another preferred embodiment of the invention respectively. The same as the above embodiment, diffusion and trench etching are employed to form p+-type and n+-type semiconductors 11 and 12 each having a predetermined thickness on top and bottom of the semiconductor wafer 10. Then, filling the metal paste in the channel on bottom of the n+-type semiconductor 12 prior to sintering. Thus, a first metal layer 13 is formed in the channel. Then deposit or implant a SiO$_2$ layer 14 on bottom of the first metal layer 13. The SiO$_2$ layer 14 is served as a first insulator layer of the ICD. A plurality of grooves are formed on the SiO$_2$ layer 14 corresponding to the adjacent first metal layer 13 along Y-axis by photolithography and trench etching. Depth of the formed groove reaches the first metal layer 13 and is filled with the metal paste prior to sintering. After sintering, a second metal layer 61 is thus formed. The second metal layer 61 is electrically connected to the n+-type semiconductor 12 via the first metal layer 13.

Thereafter, in the another embodiment, a plurality of grooves 62 are formed on top of the wafer 10 corresponding to the position between the adjacent first metal layers 13 along X and Y axes by photolithography and trench etching. Depth of the formed groove 62 penetrates the n+-type semiconductor 12 to reach the first metal layer 13. A plurality of ditches 63 are formed on the section of axis X—X between two adjacent grooves 62 along Y-axis. Depth of the formed ditch 63 reaches the n+-type semiconductor 12. As an end, the p+-type wafer 11 is divided into two portions along the section of axis X—X.

In the another embodiment, glass paste, formed by mixing glass powder and adhesive, is filled in the ditches 63, the grooves 62, and a portion of upper surface of the p+-type semiconductor 11 prior to sintering. After sintering, a plurality of sintered glass columns 74, 75 and 76 are formed as being coated on two sides of the ICD of the invention to encapsulate the ICD. Then, a gutter 80 is formed by digging the glass column 74 in the groove 62 corresponding to the second metal layer 61 along Y-axis to remove excessive glass with remaining glass sufficient to encapsulate the sides of the ICD. A depth of the formed gutter 80 reaches the second metal layer 61, and is filled with a low temperature metal paste on top of the wafer 10 corresponding to the upper surface of the p+-type semiconductor 11 uncovered by glass and the gutter 80 prior to sintering. Therefore, after sintering, first and fourth metal layers 64 and 65 are formed thereon respectively. As such, the fourth metal layer 65 is electrically connected to the n+-type semiconductor 12 via the second and the first metal layers 61 and 13 for enabling the fourth metal layer 65 to serve as a soldered metal layer of the ICD of the invention for electrically connecting to the n+-type semiconductor 12 and enabling the third metal layer 64, electrically connected to the p+-type semiconductor 11, to serve as another soldered metal layer of the ICD of the invention for electrically connecting to the p+-type semiconductor 11. Thus, in the another embodiment, two independent soldered metal layers (e.g., the third and the fourth metal layers 64 and 65) are formed on the same side (e.g., top) of the ICD. As such, each soldered metal layer may be electrically connected to p+ and n+-type semiconductors 11 and 12 of the ICD to serve as a conductive terminal of the SMD.

While the invention has been described by means of specific embodiments, numerous modifications and variations could be made thereto by those skilled in the art without departing from the scope and spirit of the invention set forth in the claims.

What is claimed is:

1. An integrated chip diode (ICD), comprising:
  a diode manufactured by utilizing a diffusion process to form two different typed semiconductors each having a predetermined thickness on two ends of a wafer respectively,
  glass insulator encapsulating side surfaces of the diode;
  one conductive metal layer formed on one end of one of the semiconductors;
  an insulation material coated on a portion of the surface of the one conductive metal layer;
  another conductive metal layer formed on the glass insulator by using sintering process, whereby said another conductive metal layer electrically connects other end of other one of the semiconductors to the insulation material, wherein the one and another conductive metal layers form two independent soldered conductive terminals at the same end of the diode, and each soldered conductive terminal is electrically connected to one of the different typed semiconductors; and wherein the one conductive metal layer comprises a first conductive metal layer and a third conductive metal layer, the first conductive metal layer being sintered on the one end of the one of the semiconductors with the insulation material coated on the portion of the surface thereof, and the third conductive metal layer being sintered on other portion of the surface of the first conductive metal layer so that the third conductive metal layer is capable of being electrically connected to the one of the semiconductors at one end via the first conductive metal layer to form a soldered conductive terminal.

2. An integrated chip diode (ICD), comprising:

a diode manufactured by utilizing a diffusion process to form two different typed semiconductors each having a predetermined thickness on two ends of a wafer respectively, glass insulator encapsulating side surfaces of the diode;

one conductive metal layer formed on one end of one of the semiconductors;

an insulation material coated on a portion of the surface of the one conductive metal layer;

another conductive metal layer formed on the glass insulator by using sintering process, whereby said another conductive metal layer electrically connects to the insulation material, wherein the one and another conductive metal layers form two independent soldered conductive terminals at the same end of the diode, and each soldered conductive terminal is electrically connected to one of the different typed semiconductors; and wherein the another conductive metal layer comprises a second conductive metal layer and a fourth conductive metal layer, the second conductive metal layer being sintered on the insulation material, and the fourth conductive metal layer being sintered on the insulation material and the other one of the semiconductors at the other end enabling the second conductive metal layer to be electrically connected to the other one of the semiconductors at the other end via the fourth conductive metal layer to form another soldered conductive terminal.

* * * * *